(12) United States Patent
Landsmeer

(10) Patent No.: US 7,651,569 B2
(45) Date of Patent: Jan. 26, 2010

(54) PEDESTAL FOR FURNACE

(75) Inventor: Timothy Robert Landsmeer, Amersfoort (NL)

(73) Assignee: ASM International N.V. (NL)

( * ) Notice: Subject to any disclaimer, the term of this patent is extended or adjusted under 35 U.S.C. 154(b) by 105 days.

(21) Appl. No.: 11/365,265

(22) Filed: Feb. 28, 2006

(65) Prior Publication Data

US 2007/0199659 A1    Aug. 30, 2007

(51) Int. Cl.
*C23C 16/00* (2006.01)
*C23C 16/458* (2006.01)

(52) U.S. Cl. .................... 118/724; 118/715; 118/725

(58) Field of Classification Search ............ 156/345.29; 118/715, 724, 725
See application file for complete search history.

(56) References Cited

U.S. PATENT DOCUMENTS

| 5,252,062 | A | | 10/1993 | Groves et al. |
| 5,308,955 | A | * | 5/1994 | Watanabe ................ 219/390 |
| 5,329,095 | A | | 7/1994 | Okase |
| 5,378,283 | A | * | 1/1995 | Ushikawa ................ 118/719 |
| 5,578,129 | A | * | 11/1996 | Moriya ..................... 118/719 |
| 5,601,428 | A | * | 2/1997 | Okoshi et al. ............ 432/241 |
| 5,662,470 | A | | 9/1997 | Huussen et al. |
| 5,755,570 | A | | 5/1998 | Shinde et al. |
| 5,846,073 | A | | 12/1998 | Weaver |
| 6,191,388 | B1 | | 2/2001 | Cleaver et al. |
| 6,332,928 | B2 | * | 12/2001 | Shealy et al. ............. 118/725 |
| 6,563,686 | B2 | | 5/2003 | Tsai et al. |
| 6,902,395 | B2 | | 6/2005 | Oosterlaken et al. |
| 2003/0175649 | A1 | * | 9/2003 | Oosterlaken et al. ...... 432/242 |

* cited by examiner

*Primary Examiner*—Jeffrie R Lund
(74) *Attorney, Agent, or Firm*—Knobbe, Martens, Olson & Bear LLP

(57) ABSTRACT

A pedestal is provided for supporting wafer boats in a process chamber during semiconductor fabrication. The pedestal contains hollow spaces, such as within porous insulating plugs, and gases inside the pedestal may expand during semiconductor processing. The pedestal has an opening for exhausting gases out of its interior and into the process chamber. The opening is provided with a filter, in the form of a sintered ceramic or glass disc sealed within a tube covering the opening, to prevent the passage of particles which may be present inside the pedestal. By filtering the particles, the filter removes a source of contamination, thereby allowing for high quality process results on wafers processed in the process chamber.

30 Claims, 4 Drawing Sheets

PEDESTAL FOR FURNACE

FIELD OF THE INVENTION

This invention relates generally to vertical furnaces for processing semiconductor substrates and, more particularly, to pedestals for supporting wafer boats in the vertical furnace.

BACKGROUND AND SUMMARY OF THE INVENTION

For high temperature processing using a wafer boat in a vertical furnace, a pedestal is commonly used at a lower end of the furnace to support the wafer boat and to provide a thermal insulation plug at the bottom of the furnace. Such a pedestal typically includes an insulating material inside a quartz envelope, with the quartz envelope supporting the wafer boat and the insulating material providing thermal insulation.

A furnace with such a pedestal is illustrated in FIG. 1A. The furnace in its entirety is indicated by reference numeral 1 and is provided with a pedestal 90. A process tube 10 includes a gas infeed tube 12 to feed gas into tube 10 at a top end thereof and the tube 10 is supported by flanges 14. Gas is exhausted from a lower end of tube 10 by a gas exhaust tube, not shown. The cylindrical process tube 10 is surrounded by a cylindrical heating coil 20, an insulation material 30 and an outer shell 40. A metal doorplate 50 supports a stationary quartz door plate 60, and includes a boat rotation bearing 70 in its center region. The bearing 70 supports a rotating quartz door plate 80, which supports the pedestal 90. The pedestal 90 supports the wafer boat 200. The pedestal 90 and the wafer boat 200 can be inserted and removed from the furnace 1 with the aid of an elevation mechanism (not shown). The wafer boat 200 protrudes into a batch process chamber or reaction space 16, i.e., the volume inside the furnace 1 in which process gases can interact with wafers (not shown) during semiconductor fabrication processes. It will be appreciated that in the illustrated furnace 1, the process tube 10, the pedestal 90 and the door plates together delimit the reaction space 16.

The insulating material inside the pedestal 90 is typically a material with a high fraction of pores, such as ceramic foam or ceramic fibrous material. The material can be various materials, such as quartz foam, $Al_2O_3$ with high porosity or a mixture of high porosity materials. Because of the high fraction of open pores and the large surface area of the insulating material, exposing the material to process gases is undesirable and the insulating material is typically placed in a quartz envelope 92. However, upon loading the pedestal 90 into a hot furnace such as the furnace 1, the pedestal 90 heats up and gases present in the quartz envelope 92 expand. With the process chamber at a temperature of, e.g., about 1000° C., and with the internal gas pressure inside the pedestal 90 at about atmospheric pressure at room temperature, the pedestal will likely explode due to an increase in the internal gas pressure caused by heating.

To prevent this explosion, one possible solution is to evacuate the pedestal during manufacturing. However, this is complicated and the pedestal might not remain gas tight during use, with possible disastrous consequences such as explosion if gas leaks into the pedestal and later expands.

Another possible solution is to provide a pressure relief opening in the quartz envelope, so that, upon expansion of the gas inside the pedestal, the gas can escape from the pedestal into the process chamber, so that the pressure inside the pedestal remains at about atmospheric pressure. The pressure relief opening can be provided at the lower side of the pedestal, close to the gas exhaust and relatively far from the wafers. Unfortunately, it appears that together with the expanding gas, many particles also escape from the interior of the pedestal into the process chamber. The particles are difficult to confine to the bottom of the pedestal and can eventually distribute throughout the process chamber. These particles can be detected on wafers processed in the process chamber, which is undesirable since the particles can degrade process results. Undesirably, the insulating material can serve as an infinite source of particles for contaminating wafers.

Accordingly, there is a need for furnace pedestals that are resistant to exploding and that are not sources of contaminating particles.

According to one aspect of the invention, the quartz envelope of the pedestal is provided with a pressure relief opening comprising a filter which is permeable for gas, allowing expanding gas to escape from the pedestal's interior, but which is not permeable for particles.

According to another aspect of the invention, a system for semiconductor processing is provided. The system comprises a batch process chamber and a wafer boat configured to be accommodated in the process chamber. A pedestal is provided for supporting the wafer boat in the process chamber. The pedestal comprises an envelope with an internal gas volume. A wall of the envelope comprises an exterior opening in gas communication with the internal volume. The exterior opening defines a flow path for gas exiting the internal volume. The pedestal further comprises a particulate filter disposed in the flow path.

According to yet another aspect of the invention, a pedestal is provided for supporting an overlying wafer boat in a process chamber of a semiconductor processing furnace. The pedestal comprises an envelope defining walls of the pedestal and an exterior opening on a surface of the envelope. A particulate filter is configured to filter gas flow through the opening.

According to another aspect of the invention, a method for semiconductor processing is provided. The method comprises providing a wafer boat containing a plurality of semiconductor substrates. The wafer boat is supported on a hollow pedestal. Particles are filtered out from gas exiting an interior of the pedestal.

BRIEF DESCRIPTION OF THE DRAWINGS

The invention will be better understood from the Detailed Description of the Preferred Embodiments and from the appended drawings, which are meant to illustrate certain embodiments of and not to limit the invention, and wherein.

DETAILED DESCRIPTION OF THE PREFERRED EMBODIMENT

According to preferred embodiments of the invention, a pedestal is provided with a relief opening, which in turn is provided with a particulate filter in the flow path of gas flowing through the opening. The filter is preferably substantially impermeable to particles in the pedestal's interior. The filter advantageously minimizes or eliminates the escape of particles out of the pedestal and into the reaction space of a furnace containing the pedestal. Thus, particulate contamination of semiconductor substrates, e.g., semiconductor wafers, processed in the furnace can be reduced, thereby allowing for higher quality process results, such as during processing at elevated temperatures, including processing at temperatures of, e.g., about 1000° C. or higher.

Reference will now be made to the Figures, wherein like numerals refer to like parts throughout.

Figure 1A:
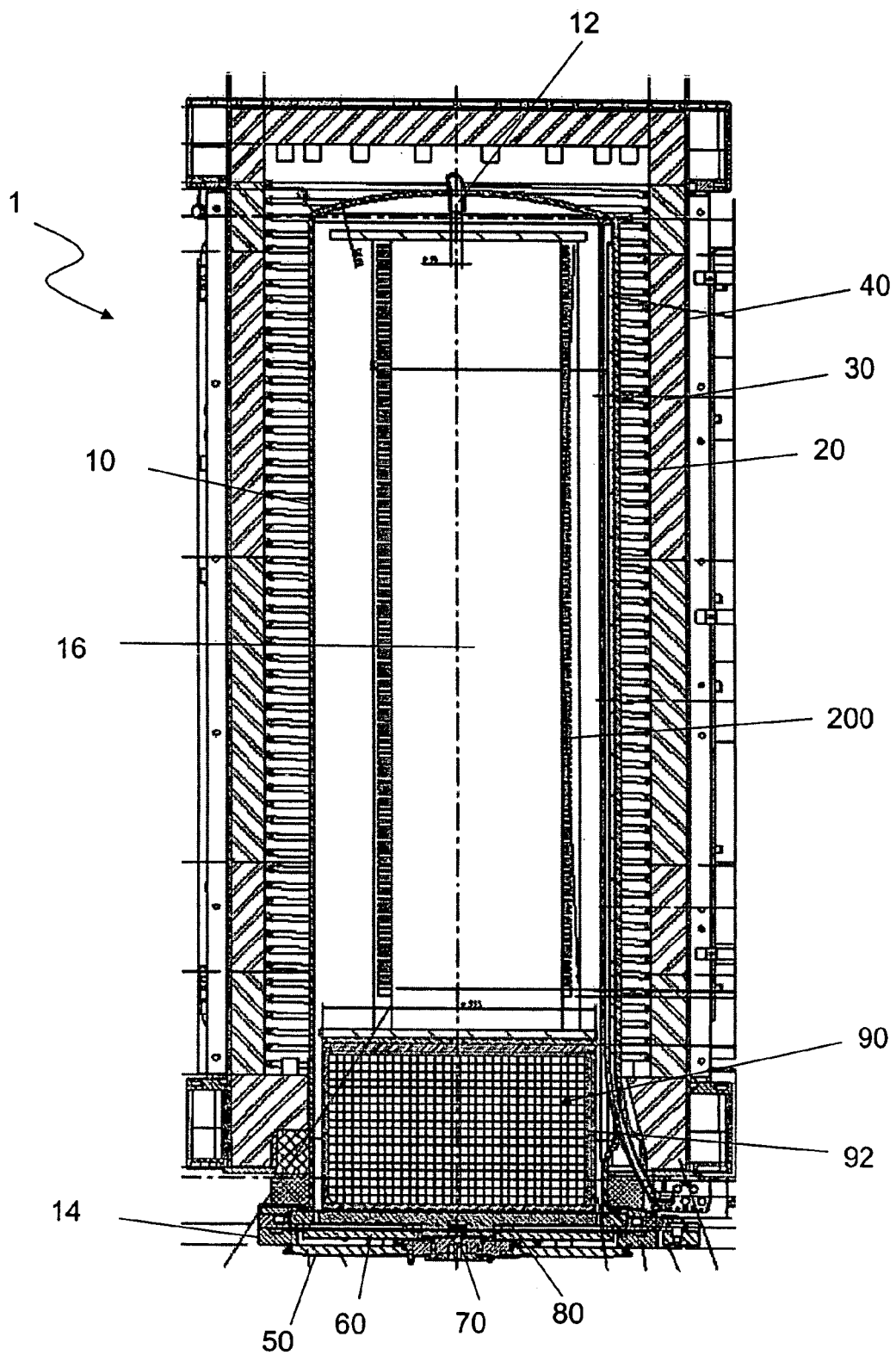
FIG. 1A is a schematic, cross-sectional side view of a furnace provided with a boat placed on a pedestal, in accordance with the prior art.
Figure 1B:
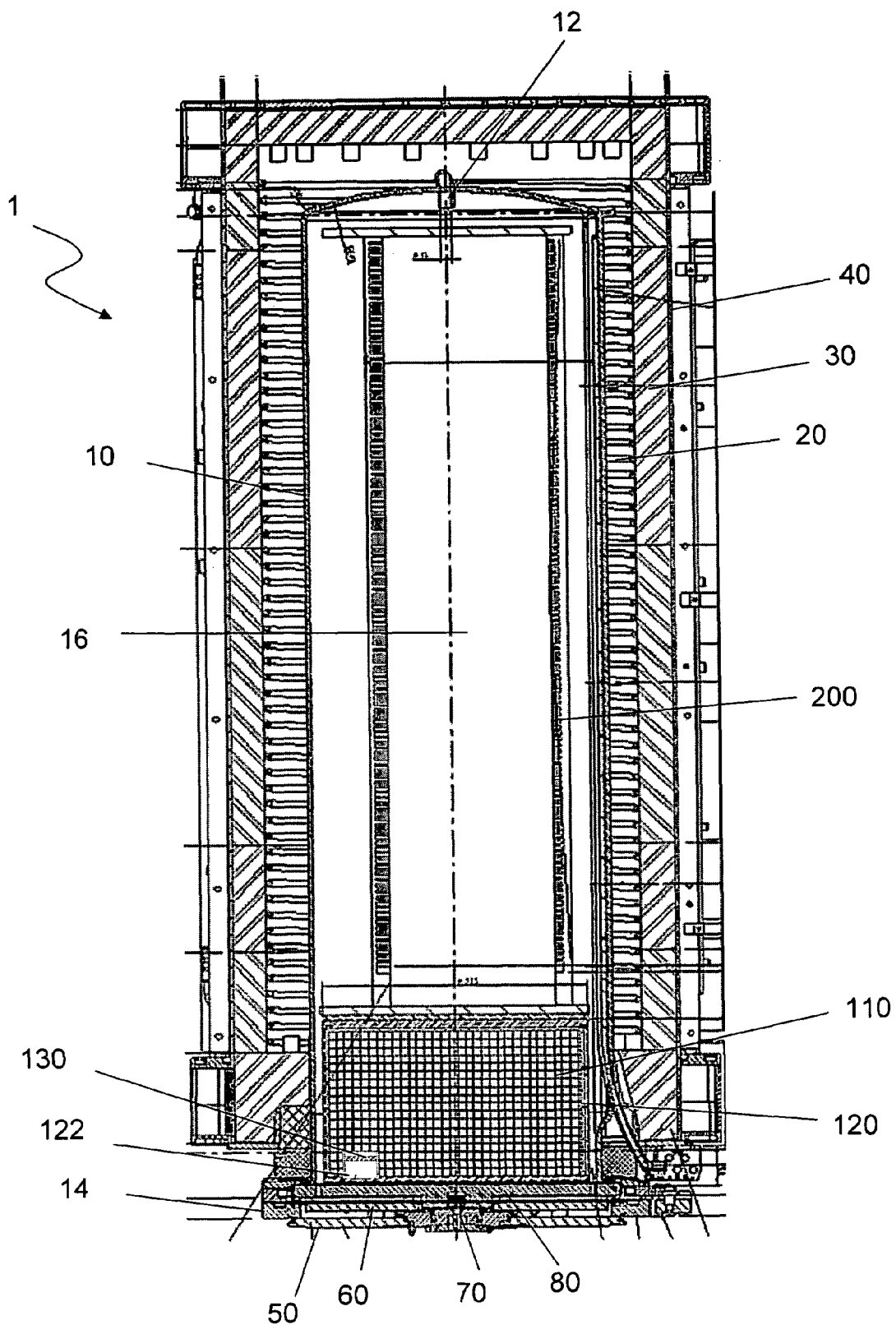
FIG. 1B is a schematic, cross-sectional side view of a furnace provided with a boat placed on a pedestal, in accordance with preferred embodiments of the invention.
Figure 2:
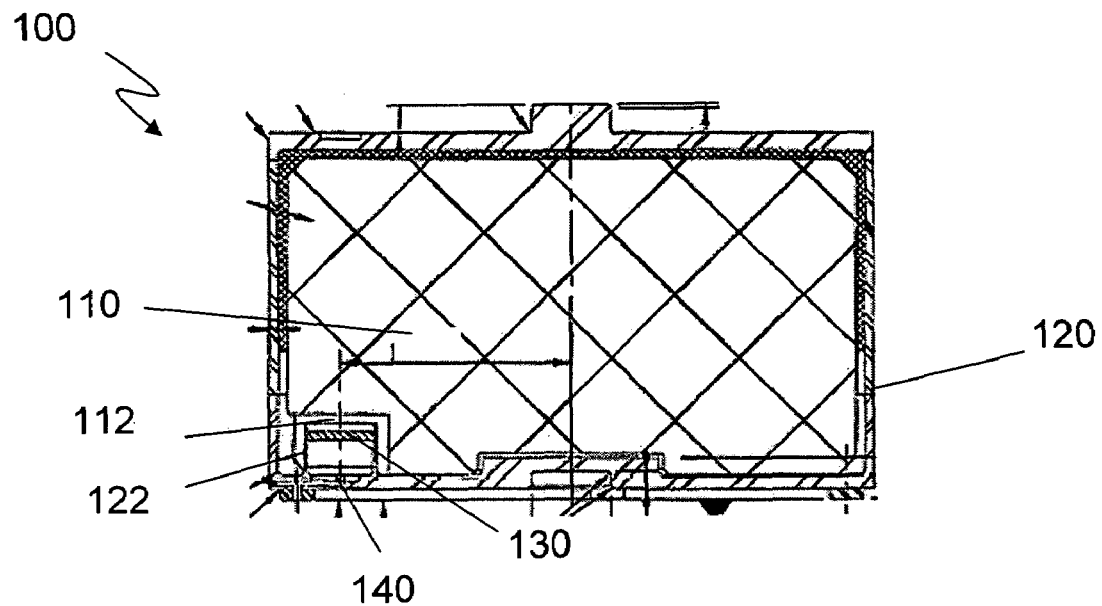
FIG. 2 is a schematic, cross-sectional side view of a pedestal provided with a filter in a pressure relief opening in its envelope, in accordance with preferred embodiments of the invention.
Figure 3:
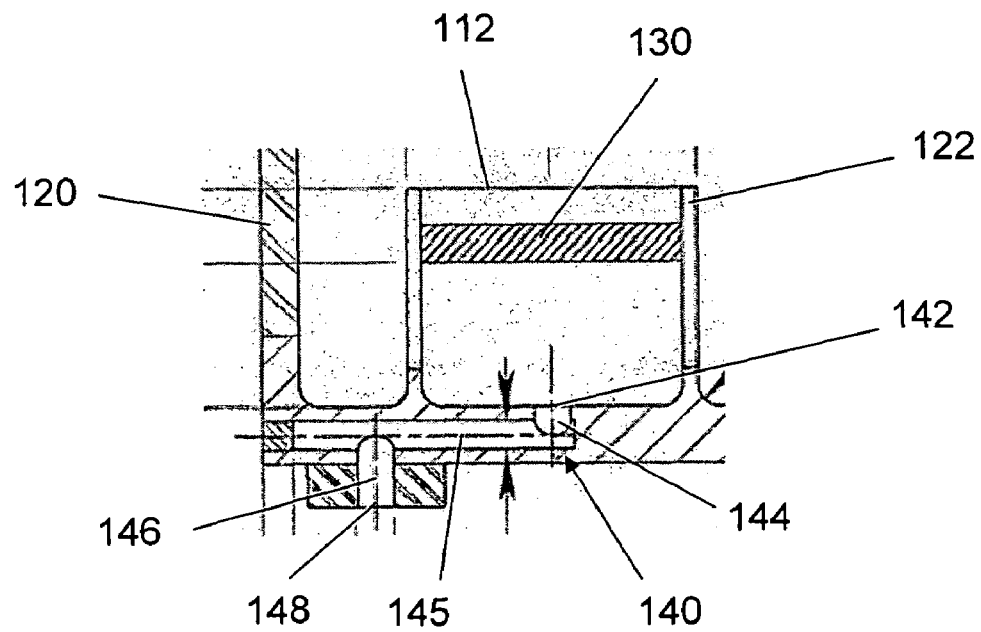
FIG. 3 is a detailed schematic, cross-sectional side view of the filter and pedestal of FIG. 2, in accordance with preferred embodiments of the invention.

With reference to FIGS. 1B, 2 and 3, a pedestal 100 according to preferred embodiments of the invention is illustrated. Advantageously, the pedestal 100 can be directly substituted for existing pedestals, such as the pedestal 90 (FIG. 1A), for use in existing furnaces, such as the furnace 1, as illustrated in FIG. 1B. The pedestal 100 includes insulating material 110 disposed within an envelope 120, preferably made of quartz. The insulating material 110 is preferably porous and can be similar to the insulating material 90 (FIG. 1A) described above, typically being a material with a high fraction of pores, such as quartz foam, $Al_2O_3$ with high porosity or a mixture of high porosity materials. A recess 112 is made in the illustrated block of insulating material 110 to accommodate an exhaust tube 122, which in the illustrated embodiment is a quartz cylinder and which is welded, with its cylinder axis perpendicular to the envelope 120 surface, to the inner surface of the bottom part of envelope 120, as illustrated. A particulate filter 130, which can be in the shape of a disc, is disposed inside the exhaust tube 122. The filter disc 130 and the exhaust tube 122 are preferably dimensioned and shaped such that gas flowing out of the envelope 120 must flow through the filter disc 130. Preferably, the outside diameter of filter disc 130 is equal to the inner diameter of the exhaust tube 122, such that the disc 130 separates the inner space of exhaust tube 122 into two parts, so that gas communication between the two parts is only possible through filter disc 130 and the other walls of the envelope 120 are airtight.

The envelope 120 is also provided with a pressure relief channel 140 which provides an outlet for gas flowing through the filter disc 130. The relief channel 140 has an interior opening 142 (FIG. 3) within the exhaust tube 122 and on the interior surface of the envelope 120. The interior opening 142 leads to a first vertical section 144, a horizontal section 145, and a second vertical section 146 of the relief channel 140, leading to an exterior opening 148. The filter disc 130 allows expanding gas to escape from the interior of the pedestal 120 through the channel 140 to the exterior of the pedestal 120, while keeping particles in the interior of the pedestal 120 confined inside the envelope 120. The exterior discharge opening 148 of the pressure relief channel 140 is preferably positioned at the bottom part of the pedestal 120, so that gas exiting the channel 140 is discharged into the process chamber 16 (FIG. 1B) at a location remote from wafers being processed.

The filter 130 is able to withstand process temperatures in the process chamber 16 (FIG. 1B) and preferably has a relatively high temperature resistance. Suitable materials for forming the filter disc 130 are sintered ceramic or glass materials in which the sintering is performed such that the material is porous and has an open pore structure that allows gas to pass through the porous material. The porous filter disc 130 can be, e.g., a porous filter disc with controlled pore size made of sintered glass powder, commercially available from Heraeus Quartzglas of Kleinostheim, Germany. In contrast to the isolating material 110 inside the pedestal 100, the porous filter discs 130 have a high purity and high integrity, so that they do not readily emit particles into a contacting fluid but rather filter the particles out. In addition, another advantageous property of these porous filter discs is that they can be joined relatively easily to clear fused quartz, such as that forming the exhaust tube 122, by welding.

Filters formed from sintered glass powder are suitable for various applications, depending on their pore size. For example, filter discs with fine pore sizes, below about 100 µm, can be used to filter or capture very small materials (pores of this size can be useful in analytical chemistry), and filters with larger pore sizes, about 100-550 µm are used for many liquid and gas distribution and filtration applications. Preferably, for use in the pedestals 100, the filters 130 have a pore size rating of about 30 µm or less, more preferably, about 20 µm or less and, more preferably, about 16 µm or less. Typically, the rated pore size is substantially the maximum size of the pores in a filter, although it will be understood that there may be some variation in the pore size, with, e.g., a negligible number of pores having a size exceeding the rated pore size.

Preferably, the porosity of the filter disc 130 is chosen based upon the sizes of the particles present inside the pedestal 100. The pores are preferably of a similar size or smaller than the sizes of the particles for which filtration is desired. It has been found that good results can be obtained with a filter disc #4, having a maximum pore size of about 10-16 µm. This is the filter disc with the smallest pore size currently available from Heraeus Quartzglas. Although this pore size is still larger than the dimensions of some particles, it will be appreciated that these particles do not easily pass the porous filter disc if the filter disc is sufficiently thick, so that the path of the particles out of the porous filter is long. Preferably, the pore size is about 10 or more times, more preferably 100 times or more, smaller than the thickness of the porous filter disc.

In the exemplary embodiment shown in FIGS. 2 and 3, the filter disc 130 has a diameter of about 35 mm and a thickness of about 4 mm. It will be clear to a person of skill in the art that different dimensions and designs are possible, e.g., the filter disc 130 and the mating exhaust tube 122 are not necessarily cylindrical but can have any other shape as long as they allow the filter 130 to effectively filter particles from the interior of the pedestal 100. For example, the filter disc 130 and/or the exhaust tube 122 can be in the shape of a square or rectangle. Preferably, whatever the shape, the filter disc 130 is plate-like. In other embodiments, a part of the envelope 120 or the entire envelope 120 can be made of a porous material having a high integrity, e.g., the entire bottom of the pedestal 100 can be made of the porous material, allowing the bottom to act as a filter. In yet other embodiments, a part of the quartz material of the envelope 120 can be replaced by a porous filter disc 130, such that the porous filter disc separates the interior of the pedestal 120 from the exterior ambient and gas transport is only allowed through the porous filter disc 130 or other shaped filter plate. It will also be appreciated that multiple filter plates can be provided in the pedestal 100 and/or multiple surfaces of the pedestal 100 can be provided with porous material which functions as a filter.

Figure 4A:
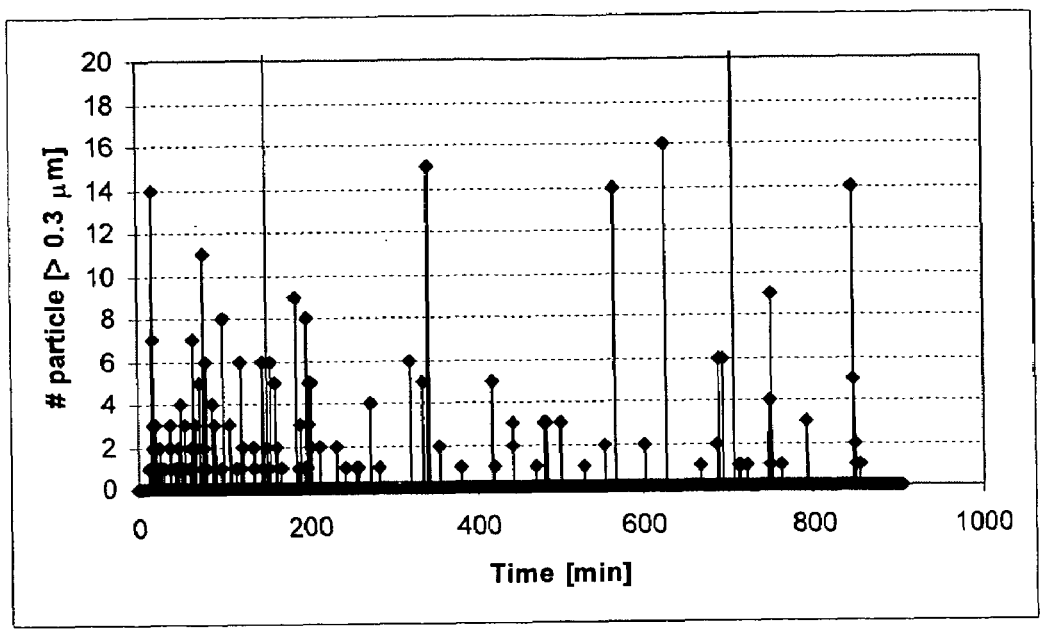
FIG. 4A is a plot showing the number of detected airborne particles over time, in a furnace having a pedestal without a filter in its relief opening.
Figure 4B:
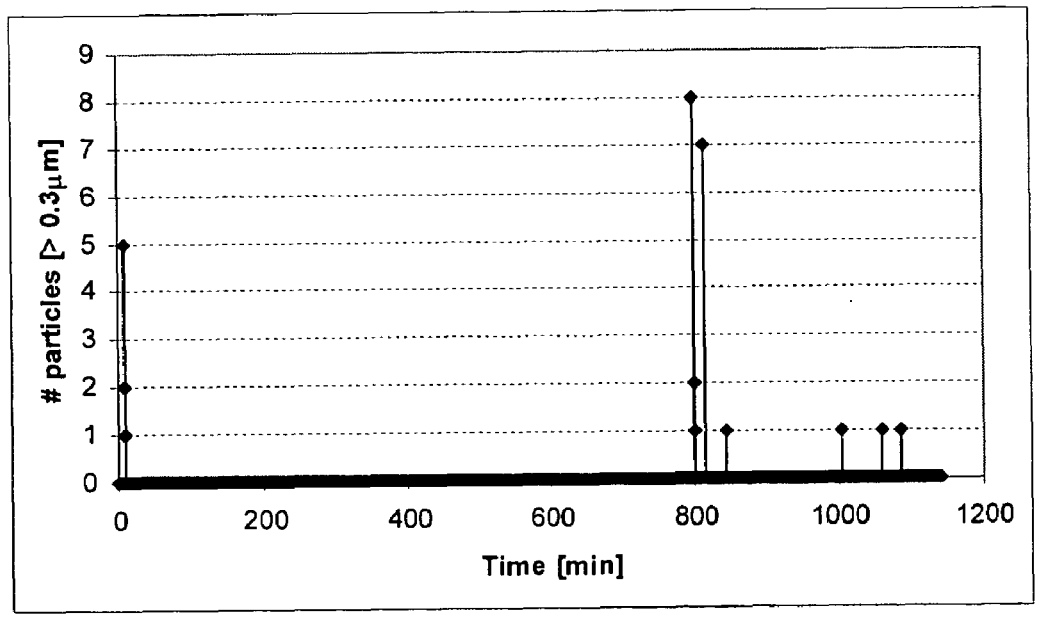
FIG. 4B is a plot showing the number of detected airborne particles over time, in a furnace having a pedestal provided with a filter in its relief opening, in accordance with preferred embodiments of the invention.

The effect of the filter disc 130 can be seen in FIGS. 4A and 4B. The presence of air borne particles having a size of 0.3 μm or more was measured in a quartz exhaust channel connected to the process tube of a vertical furnace. A valve downstream in the exhaust channel was repeatedly switched, resulting in repeated pressure fluctuations. A pressure reduction resulted in escape of gas from the interior of a pedestal, and a pressure increase resulted in gas streaming into the pedestal. Air borne particles were measured continuously at regular time intervals. The results for a conventional pedestal with a pressure relief opening are shown in FIG. 4A and the result for a pedestal provided with a filter disc in the pressure relief opening, in accordance with the preferred embodiments, are shown in FIG. 4B.

Advantageously, it can be observed that the filter is effective in reducing the number of particles. FIG. 4B shows the presence of few particles, especially in comparison to FIG. 4A. The high counts at t=800 minutes in FIG. 4B can be attributed to the movement of the pedestal and boat at that time (movement of the pedestal and the boat out and then back into the process chamber). Thus, the particles measured at that time are likely not particles which escaped from the interior of the pedestal. At other times, the boat and pedestal remained in a stationary position inside the process chamber, with the door to the chamber closed. The difference in performance is even more pronounced when it is taken into account that the conventional pedestal had been already in use for months whereas the pedestal having a filter was new. It will be appreciated that the particle counts of a conventional pedestal are typically much higher when new and can be expected to decrease over time. Thus, the particle levels shown in FIG. 4A would be higher, if the pedestal used in those tests were as new as the pedestal used in the tests for FIG. 4B. Nevertheless, it can seen that the pedestal with the filter allows for a dramatic reduction in the number of particles present.

It will be appreciated that various modifications, omissions and additions may be made to the methods and structures described above without departing from the scope of the invention. All such modifications and changes are intended to fall within the scope of the invention, as defined by the appended claims.

I claim:

1. A furnace for semiconductor processing, comprising:
a batch process chamber;
a wafer boat configured to be accommodated in the batch process chamber;
a pedestal for supporting the wafer boat in the batch process chamber, the pedestal comprising:
   insulating material disposed in an interior of the pedestal;
   an envelope with an internal gas volume, the envelope formed of quartz and defining exterior walls of the pedestal, a wall of the envelope comprising an exterior opening in gas communication with the internal gas volume, the exterior opening disposed in and opening to an interior volume of the batch process chamber, the exterior opening allowing gas communication between the internal gas volume of the pedestal and the interior volume of the batch process chamber; and
   a particulate filter forming an airtight seal with the exterior opening, the particulate filter disposed in a flow path of gas exiting the internal volume, wherein the particulate filter is formed of a material different from the insulating material.

2. The system of claim 1, wherein pores of the particulate filter have a pore size rating of about 20 μm or less.

3. The system of claim 1, wherein the particulate filter is a plate.

4. The system of claim 1, further comprising a tube extending into the internal gas volume of the pedestal, the tube and forming a seal with surfaces of the wall, the particulate filter forming a seal with surfaces of the tube, wherein the tube defines the exterior opening.

5. The system of claim 4, further comprising a channel in gas communication with the tube, wherein the channel extends through the envelope and opens to the batch process chamber gas volume.

6. The system of claim 1, wherein the envelope is gas-tight except for the exterior opening.

7. The system of claim 1, wherein the internal gas volume comprises insulating material.

8. The system of claim 7, wherein the insulating material is porous.

9. The system of claim 1, wherein the batch process chamber is disposed within a vertical furnace.

10. The system of claim 1, wherein the wafer boat is configured to sit directly on the pedestal.

11. A pedestal for supporting an overlying wafer boat in a process chamber of a semiconductor processing furnace, the pedestal comprising:
an envelope defining walls of the pedestal, the envelope formed of quartz;
insulating material disposed in an interior of the pedestal;
an exterior opening on a surface of the envelope, the exterior opening configured to open to an interior volume of the batch process chamber; and
a particulate filter forming a seal with the exterior opening and configured to filter gas flow through the exterior opening, the particulate filter formed of a porous material having a pore size rating of about 30 μm or less.

12. The pedestal of claim 11, wherein the particulate filter is configured to provide a sole exit for gases flowing out from an interior of the pedestal.

13. The pedestal of claim 11, wherein the filter comprises a sintered material.

14. The pedestal of claim 13, wherein the sintered material comprises sintered ceramic.

15. The pedestal of claim 13, wherein the sintered material comprises sintered glass powder.

16. The pedestal of claim 15, wherein the filter is formed of sintered glass powder and is welded to a quartz surface of the envelope.

17. The pedestal of claim 11, wherein the pore size rating is about 20 μm or less.

18. The pedestal of claim 17, wherein the maximum pore size is about 16 μm or less.

19. The pedestal of claim 11, wherein the filter comprises a porous material having a pore size rating smaller than a thickness of the filter by a factor of about 10 or more.

20. The pedestal of claim 19, wherein the filter comprises a porous material having a pore size rating smaller than a thickness of the filter by a factor of about 100 or more.

21. The pedestal of claim 11, wherein the filter is configured to block particles having a size of 0.3 μm or greater.

22. The pedestal of claim 11, wherein the filter is separate from a wall of the pedestal.

23. The pedestal of claim 11, wherein the exterior opening is in gas communication with a tube attached to the envelope, the tube extending into an interior of the envelope.

24. The pedestal of claim 23, wherein the tube is in gas communication with a channel extending through the envelope and terminating in the exterior opening.

25. The pedestal of claim 23, wherein the tube is cylindrically shaped and wherein the filter is a disc disposed within the tube.

26. The pedestal of claim 25, wherein the filter is fused to the tube.

27. The pedestal of claim 23, wherein the tube is formed of quartz.

28. The pedestal of claim 11, wherein the exterior opening is provided in a lower portion of the pedestal.

29. The pedestal of claim 28, wherein the exterior opening is provided in a bottom surface of the pedestal.

30. The pedestal of claim 11, wherein an interior of the pedestal is provided with insulating material comprising quartz foam, high porosity $Al_2O_3$ or combinations thereof.

* * * * *

UNITED STATES PATENT AND TRADEMARK OFFICE
CERTIFICATE OF CORRECTION

| | | |
|---|---|---|
| PATENT NO. | : 7,651,569 B2 | Page 1 of 1 |
| APPLICATION NO. | : 11/365265 | |
| DATED | : January 26, 2010 | |
| INVENTOR(S) | : Timothy Robert Landsmeer | |

It is certified that error appears in the above-identified patent and that said Letters Patent is hereby corrected as shown below:

Title page, item (*) Notice: should read as follows: Subject to any disclaimer, the term of this patent is extended or adjusted under 35 U.S.C. 154(b) by 150 days.

In Col. 5, line 34, after "can" please insert --be--.

In Col. 6, line 6, Claim 4, after "tube" please delete "and".

Signed and Sealed this

Twentieth Day of July, 2010

David J. Kappos
*Director of the United States Patent and Trademark Office*